United States Patent [19]

Hamakawa et al.

[11] Patent Number: 4,634,601

[45] Date of Patent: Jan. 6, 1987

[54] METHOD FOR PRODUCTION OF SEMICONDUCTOR BY GLOW DISCHARGE DECOMPOSITION OF SILANE

[75] Inventors: Yoshihiro Hamakawa, Kawanishi; Hideo Yamagishi, Kyoto; Yoshihisa Tawada, Kobe, all of Japan

[73] Assignee: Kanegafuchi Kagaku Kogyo Kabushiki Kaisha, Osaka, Japan

[21] Appl. No.: 716,302

[22] Filed: Mar. 26, 1985

[30] Foreign Application Priority Data

Mar. 28, 1984 [JP] Japan .................................. 59-61650

[51] Int. Cl.$^4$ .......................... B05D 3/06; B05D 5/12
[52] U.S. Cl. ....................................... 427/39; 427/86; 427/248.1; 427/249; 427/255; 427/255.1; 427/255.2
[58] Field of Search ................... 427/39, 86, 87, 248.1, 427/249, 255, 255.1, 255.2

[56] References Cited

U.S. PATENT DOCUMENTS

| | | |
|---|---|---|
| 4,064,521 | 12/1977 | Carlson .................................. 427/39 |
| 4,262,631 | 4/1981 | Kubacki ................................. 427/39 |
| 4,410,559 | 10/1983 | Hamakawa et al. .................. 427/39 |
| 4,452,828 | 6/1984 | Namba et al. ......................... 427/39 |
| 4,460,673 | 7/1984 | Sukigara et al. ...................... 427/39 |
| 4,492,736 | 1/1985 | Tanner .................................. 427/39 |
| 4,532,150 | 7/1985 | Endo et al. ............................ 427/39 |

Primary Examiner—Sadie L. Childs
Attorney, Agent, or Firm—Armstrong, Nikaido, Marmelstein & Kubovcik

[57] ABSTRACT

The production of a semiconductor by the glow discharge decomposition of a silane type gas is accomplished advantageously by a method which comprises effecting the glow discharge decomposition of introduced silane type gas with a plurality of opposed electrodes disposed substantially perpendicularly to a substrate and insulated from the ground potential and subsequently allowing the product of the decomposition to be deposited on the substrate disposed so as to be exposed to the introduced silane type gas. The semiconductor obtained by this method is free from the drawbacks suffered by the conventional method using a power source of high frequency.

2 Claims, 4 Drawing Figures

METHOD FOR PRODUCTION OF SEMICONDUCTOR BY GLOW DISCHARGE DECOMPOSITION OF SILANE

BACKGROUND OF THE INVENTION

1. Field of the Invention

This invention relates to a method for the production of a semiconductor.

2. Description of the Prior Art

It was found in 1975 by W. E. Spears et al. that on the amorphous silicon obtained by the plasma decomposition of silane ($SiH_4$), valence electron control can be effected by doping the amorphous silicon with phosphine ($PH_3$) or diborane ($B_2H_6$). In 1976, D. E. Carlson et al. succeeded in trial manufacture of a solar cell using amorphous silicon. The amorphous silicon thus leaped in the limelight of scientific concern and has since been inducing active researches devoted to exploring the feasibility of the substance as the material for solar cell.

As fruits of such researches conducted on the pin heterojunction type solar cell, since A. Catarano et al. unveiled their success in attaining a conversion efficiency of 10.1%, several research results have been published indicating conversion efficiencies exceeding the level of 10%. Consequently, the pin hetero-junction type solar cell has come to attract growing interest as a thin-film solar cell of high-conversion efficiency.

The amorphous silicon films used in forming solar cells of high conversion efficiency are invariably produced by the glow discharge decomposition using power sources of frequencies near or above the level of 13.56 MHz. Successful production of a solar cell of such high conversion efficiency by the glow discharge decomposition using a power of a lower frequency has not yet been reported. The necessity for this high frequency may be logically explained by a postulate that when the parallel plate type electrode which has an electrode disposed parallel to a substrate and a susceptor and effects glow discharge preponderantly between the electrode and the substrate or the susceptor is used to effect the glow discharge under conditions involving a low frequency, a solar cell of high performance is not obtained because the time required for field inversion is long, the energy given to various ions produced by the glow discharge decomposition is large in magnitude, and the semiconductor film being deposited on the substrate suffers from degradation of quality because of collision of such ions against the film. Particularly in the discharge at a frequency of less than 13.56 MHz which takes up much time in field inversion, the degradation of the film quality is conspicuous because the kinetic energy possessed by ions is large.

On the other hand, when the semiconductor film is produced by using a power source of a frequency exceeding about 13.56 MHz, there are inevitably entailed the following problems.

(1) Necessity for impedance matching is inevitable and consequent complication of equipment is unavoidable.
(2) Noise trouble in the megahertz zone which impedes automation of equipment is liable to occur.
(3) Power distribution within the electrode has no insignificant effect when the semiconductor film to be produced has a large surface area.

It is considered that these problems may be precluded or notably mitigated by lowering the frequency of the power source. When the frequency of the power source is lowered, however, initiation of discharge becomes difficult particularly in the case of DC glow discharge. This drawback is not very serious in the case of an internal electrode. In the case of an external electrode such as a glass tube or a quartz tube which has an exposed electrode, it is said that discharge under ordinary conditions is difficult to obtain unless high voltage is applied or a trigger is provided or some other remedial measure is taken.

In view of the true state of affairs described above, the inventors continued a diligent study in search of a method capable of producing a semiconductor of high performance even by the use of a power source of a low frequency. They have consequently perfected this invention.

SUMMARY OF THE INVENTION

This invention concerns a method for the production of a semiconductor by the glow discharge decomposition of a silane type gas, which is characterized by effecting the glow discharge decomposition of introduced silane type gas with a plurality of opposed electrodes disposed substantially perpendicular to a substrate and insulated from the ground potential and subsequently allowing the product of the decomposition to be deposited on the substrate disposed so as to be exposed to the introduced silane type gas.

BRIEF DESCRIPTION OF THE DRAWINGS

The characteristic features of the present invention will become apparent from the description given in further detail herein below with reference to the accompanying drawings, in which.

Figure 1:
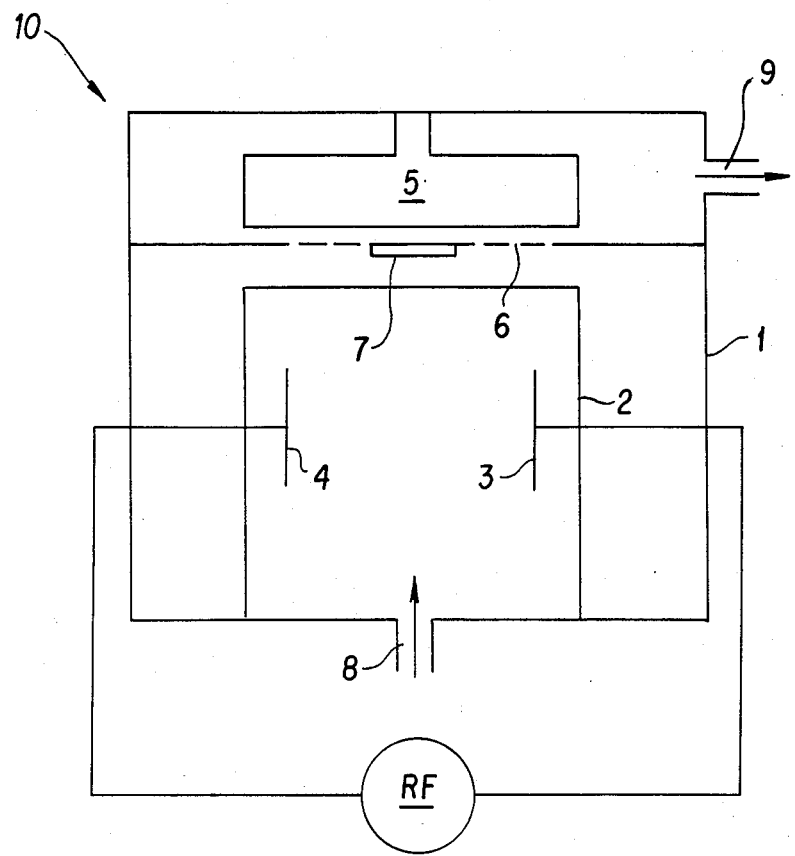
FIG. 1 is a schematic side view illustrating a typical apparatus to be used in working the method of this invention.

In the diagram, (3) and (4) each denote an electrode and (7) denotes a substrate.

DETAILED DESCRIPTION OF THE PREFERRED EMBODIMENT OF THE INVENTION

Examples of the silane type gas effectively usable in this invention include silane, disilane, silanes of higher orders, and mixtures thereof which are gaseous in the state of aggregation. The silane type gas so selected can be used independently or may be used as diluted with hydrogen or an inert gas such as argon, helium, or nitrogen. Optionally, it may incorporate therein a compound containing such an element as P, B, N, or C.

In this invention, the aforementioned silane type gas is introduced into the apparatus and, while being passed between a plurality of electrodes disposed substantially perpendicular to a substrate and insulated from the ground potential, is subjected to glow discharge produced by the electrodes.

The amount of the silane type gas so introduced cannot be generally fixed because it is variable with the size of the apparatus, the composition of the silane type gas, the amount of spent gas discharged, and the capacity of power source. Generally, it is introduced in an amount in the range of about 1 to 1,000 sccm so that the internal pressure of the apparatus will be maintained in the range of $10^{-2}$ to 10 Torrs.

The silane type gas thus introduced is decomposed by glow discharge while it is passed between a plurality, generally about 2 to 10, electrodes separated by a fixed distance falling in the range of 2 to 50 cm under application of a voltage in the range of about 300 to 2,000 V at a frequency in the range of 1 KHz to 10 MHz, preferably 1 to 500 KHz.

If the frequency is less than 1 KHz, it becomes less easy to produce a semiconductor film of satisfactory performance because the occurrence of ion species during the decomposition increases abruptly or because the initiation of discharge is difficult. If the frequency exceeds 10 MHz, necessity for impedance matching arises, noise trouble in the megahertz zone emerges, and degradation of film quality becomes prominent when the area of film being produced is increased.

In this invention, the plurality of electrodes to be used are invariably insulated from the ground potential. Unlike the conventional electrodes which are grounded on purpose, the insulation of the electrodes contemplated by this invention notably discourages discharge between the substrate or the susceptor and the electrodes, enables discharge to be generated preponderantly by the electric field between the electrodes, and conspicuously alleviates the collision of ions against the substrate.

The silane type gas which has undergone the glow discharge decomposition advances toward the substrate which is exposed to the introduced silane type gas and disposed substantially perpendicularly to the aforementioned electrodes. Consequently, the product of decomposition is deposited on the substrate.

The expression "substantially perpendicular" as used in the specification hereof is meant to describe a concept embracing a case wherein the bearing of the electrodes to the substrate is deviated from the true perpendicularity to an extent such that the damage done to the apparatus by ions will be mitigated and rendered insignificant.

This invention does not particularly discriminate the substrate by its type. Generally, any of the substrates which are used at all for the production of a semiconductor can be adopted. Since the deposition of the layer of semiconductor is carried out on a substrate kept at a temperature in the range of about 180° to 300° C., the substrate to be selected is desired to possess resistance to heat.

After the product of glow discharge decomposition has been amply deposited on the substrate, the silane type gas surviving the decomposition is released from the apparatus into the ambient air.

Now, the method of this invention will be described below with reference to the accompanying drawings.

FIG. 1 is an explanatory diagram illustrating a capacitive coupling high-frequency glow discharge decomposition device (10) which is a typical reaction apparatus usable for working the present invention.

In FIG. 1, (1) denotes a reaction furnace made of stainless steel, for example. The reaction furnace (1) is provided with an inlet (8) for introducing a silane type gas.

The silane type gas which is supplied through the inlet (8) flows along a reaction tube (2) made of glass or quartz and adapted to define a flow path for the gas and then flows toward a substrate (7) which is mounted so as to be exposed to the flow of the silane type gas by a susceptor (6) formed where the wall of the reaction tube (2) is discontinued.

In the reaction tube (2), RF electrodes (3), (4) are disposed parallel to the direction of the flow of the silane type gas, namely substantially perpendicular to the substrate (7) set in place by the susceptor (6). The RF electrodes (3), (4) are insulated from the ground potential. While the silane type gas is passing between the electrodes, it undergoes glow discharge decomposition.

In FIG. 1, the electrodes are disposed inside the reaction tube (2) to constitute themselves internal electrodes. Optionally, they may be disposed outside the reaction tube so as to constitute themselves external electrodes.

The silane type gas which has undergone the glow discharge decomposition comes into contact with the substrate and, as the result, the product of decomposition is deposited on the substrate (7). During the deposition of the product of decomposition, the substrate (7) is kept heated by a heater (5) disposed on the side opposite the reaction tube (2) across the substrate (7). Thus, a semiconductor film is formed at a proper temperature.

The contact of the aforementioned product of decomposition with the substrate (7) is desired to proceed uniformly throughout the entire surface of the substrate and permit the deposition to occur efficiently. For the fulfilment of this object, the susceptor (6) for mounting the substrate (7) is desired to be provided with perforations for permitting passage of the silane type gas in the portion between the reaction tube (2) and the heater (5), namely the neighborhood of the seat of the substrate (7), the distance between the electrodes and the susceptor to be decreased enough to mitigate the collision of ions and permit passage of the silane type gas near the substrate (7), and the other parts to separate the reaction tube (2) side and the heater (5) side of the reaction furnace (1). Of course, the susceptor (6) may be adapted only to fulfil the function of keeping the substrate (7) in place.

The silane type gas which has come into contact with the substrate (7) and has caused deposition of the product of decomposition is discharged through an outlet (9) disposed on the heater side of the reaction furnace (1).

In the manner described above, a semiconductor of amorphous type or microcrystalline type suitable for use in the solar cell is produced.

When the semiconductor is produced by the method of this invention using an apparatus constructed as illustrated in FIG. 1, the glow discharge decomposition occurs between the two electrodes and the ions consequently generated are reciprocated preponderantly between the electrodes. The undesirable collision of these ions against the substrate is substantially eliminated.

Thus, production of a semiconductor film of high quality is materialized.

Now, the method of the present invention will be described below with reference to working examples.

EXAMPLE 1

A glow discharge decomposition apparatus constructed as shown in FIG. 1 was used. In the apparatus, electrodes (3), (4) 20.0 cm² in surface area were disposed so that the distance separating the electrodes from each other was 7.5 cm and the distance from the susceptor to the ends of the electrodes nearer to the susceptor was 2 cm. At a prescribed power source frequency, voltage of 600 V was applied between the opposed electrodes to effect glow discharge decomposition of silane.

A sheet glass (product of Corning Glass marketed under trademark designation of "Corning 7059") 2 cm×2 cm was fixed in advance to the susceptor. The internal pressure of the reaction furnace was lowered with a turbo-molecular pump to $10^{-6}$ Torr. Then the glass was heated with a heater to 225° C. Thereafter, 10 mol % silane ($SiH_4$) gas diluted in advance with hydrogen was introduced in a flow volume of 60 sccm into the reaction furnace and, at the same time, the spent gas was discharged through the outlet, with the internal pressure of the reaction furnace regulated at 1.0 Torr. When the gas inside the reaction furnace reached steady state, sinusoidal voltage was applied at a prescribed frequency between the electrodes to effect glow discharge decomposition. The duration of discharge was adjusted so that the thickness of the formed amorphous silicon film would fall in the range of 5,000 to 7,000 Å. After termination of the discharge, the formed film was allowed to cool off to normal room temperature. Then, Al was vacuum deposited to form a coplanar type electrode 1.5 cm in width. In this case, the amorphous silicon film grew at a speed of 0.6 to 1.1 Å/second.

Figure 2:
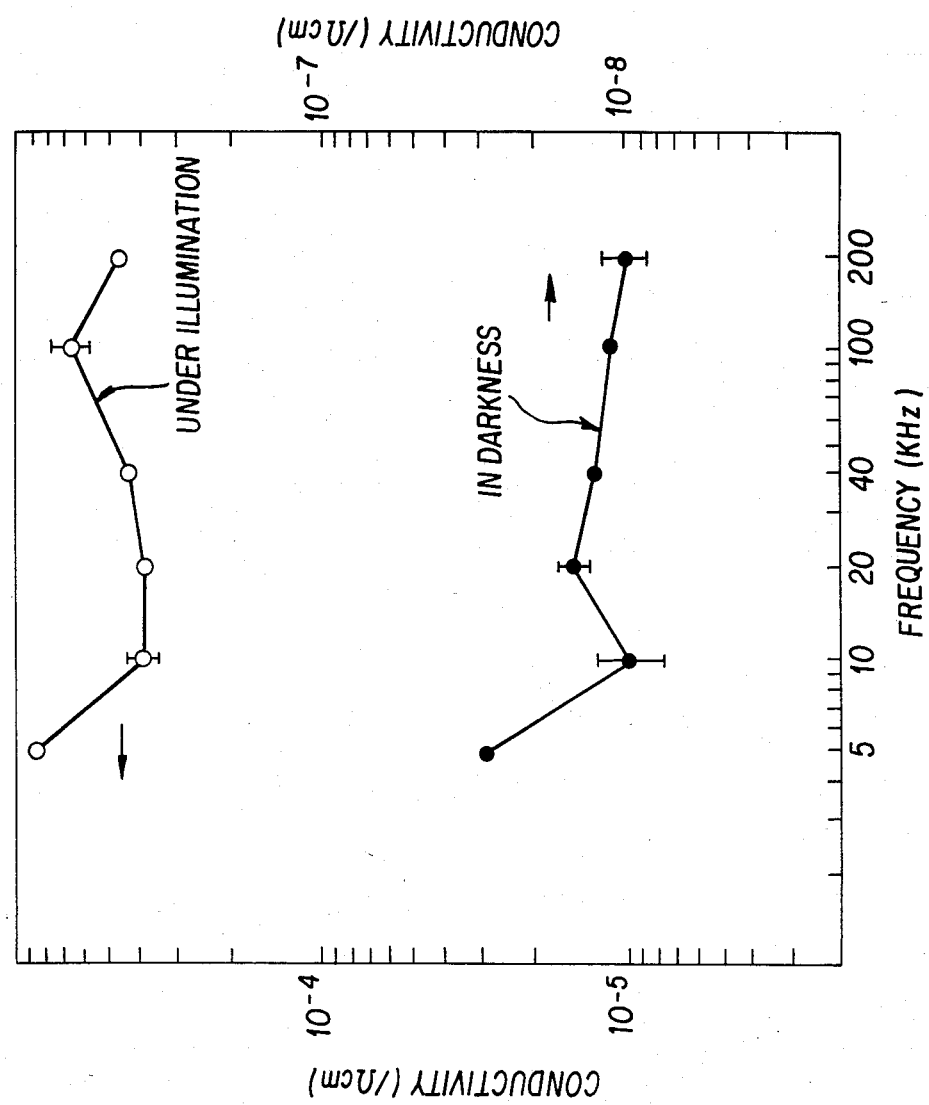
FIG. 2 is a graph showing the relation between the electric conductivity and the frequency determined in darkness and under illumination of a semiconductor film obtained by glow discharge carried out with the apparatus of FIG. 1 using a power source of a low frequency.

The amorphous silicon film so produced was tested for electric conductivity in darkness and under illumination (with an AM-1 light of 100 mW/cm²). The results are shown in FIG. 2.

Since no frequency-variable output meter was available for the power source used in this experiment, the exact output of the power source remained unknown.

COMPARATIVE EXPERIMENT 1

In the reaction furnace used in Example 1, the two electrodes were removed and a circular electrode 7.0 cm in diameter was disposed parallel to the substrate instead. The distance between the susceptor and the electrode was 5.0 cm. The electrode was connected to the terminal of the power source. One of the terminals of the power source and the susceptor were grounded so as to generate discharge between the electrode and the susceptor.

By using the parallel substrate type electrode thus installed, glow discharge decomposition was effected under the same conditions as those of Example 1 at a prescribed frequency, to produce an amorphous silicon film. This amorphous silicon film grew at a speed of 1.8 to 3.1 Å/sec.

Figure 3:
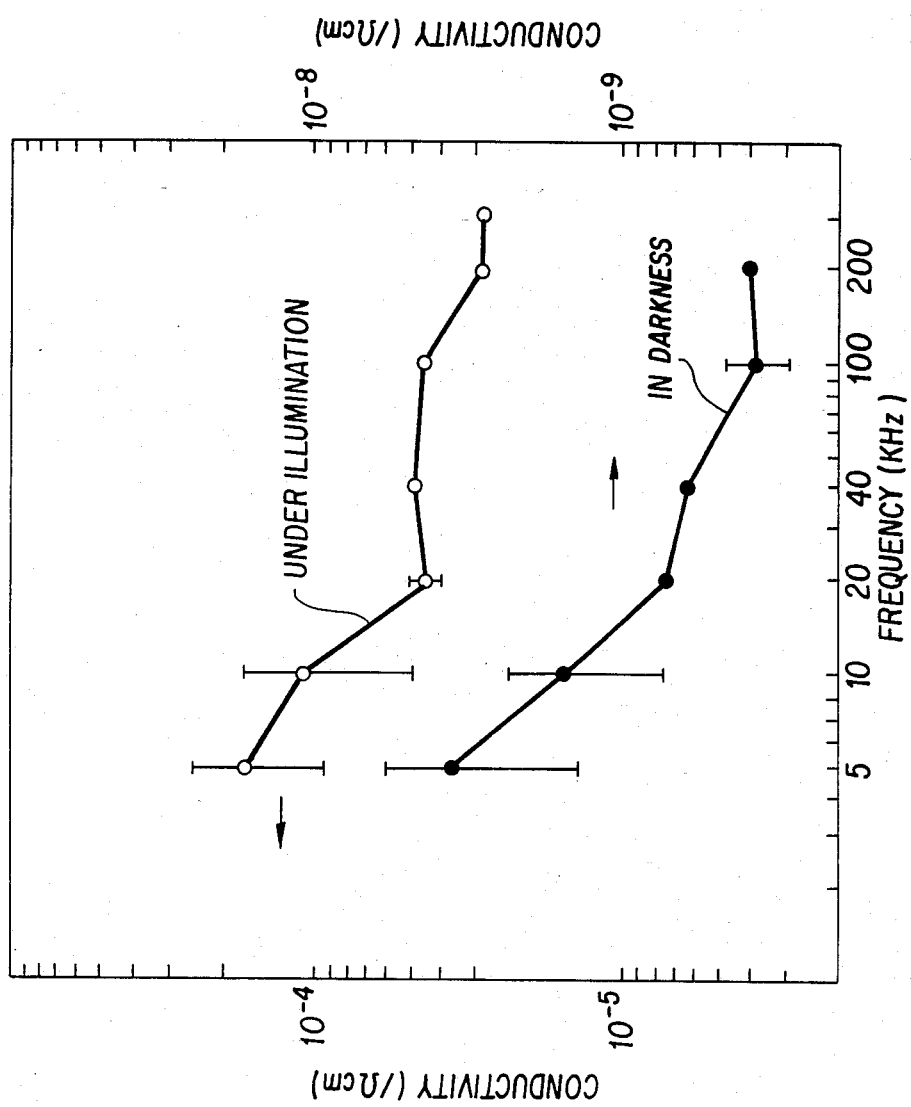
FIG. 3 is a graph showing the relation between the electric conductivity and the frequency determined in darkness and under illumination of a semiconductor film obtained by low-frequency glow discharge carried out with a parallel plate type electrode.

In FIG. 3, the electric conductivity determined in darkness and the electric conductivity determined under illumination under the same conditions as those of Example 1 are shown.

COMPARATIVE EXPERIMENT 2

In the same apparatus as used in Comparative Experiment 1, the glow discharge decomposition was carried out at a high frequency of 13.56 MHz. The high frequency output was varied from 10 W to 40 W during the glow discharge.

An amorphous silicon film consequently obtained was tested for electric conductivity under illumination by following the procedure of Example 1. The results are shown in FIG. 4.

Figure 4:
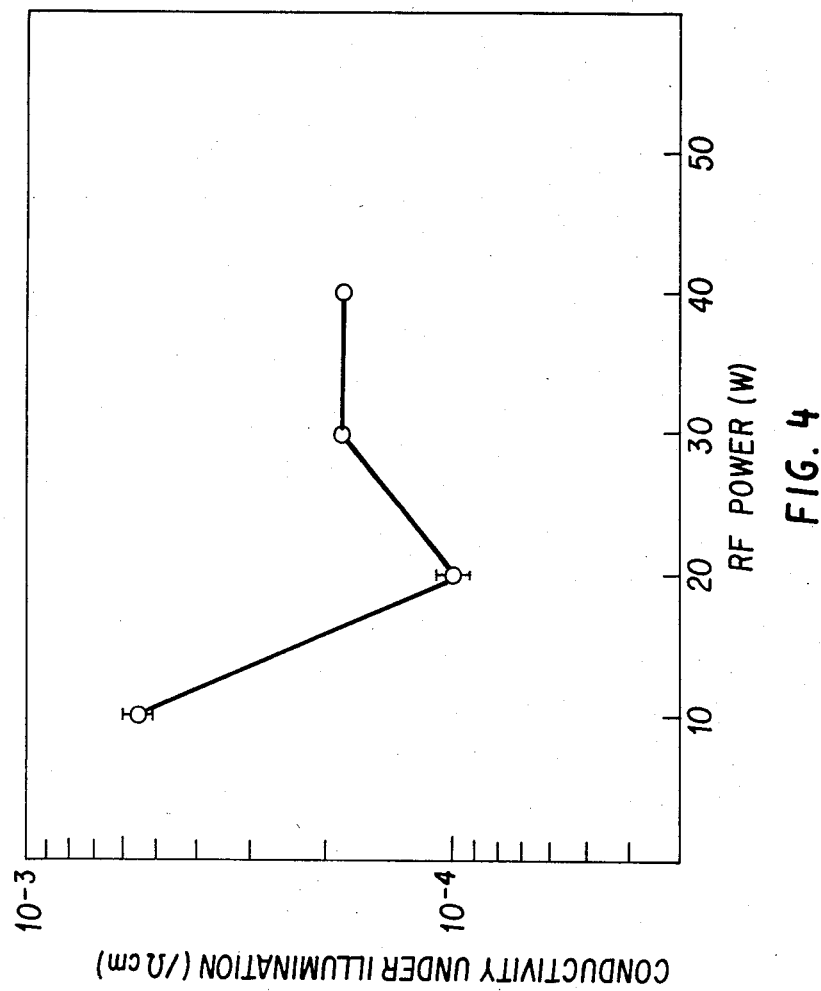
FIG. 4 is a graph showing the relation between the electric conductivity and the high-frequency output (RF power) determined under illumination of a semiconductor film obtained by glow discharge at a high frequency of 13.56 MHz by the use of the same apparatus as that of FIG. 3.

From the results of the determination of electric conductivity under illumination shown in FIGS. 2-4, it is noted that the method using the parallel plate electrode at a frequency of 13.56 MHz produced an amorphous silicon film exhibiting electric conductivity of $9.8 \times 10^{-3}$ to $6.0 \times 10^{-4}$ $(\Omega\ cm)^{-1}$ under illumination of 10 to 40 W (0.26 to 1.0 $^4$ W/cm²) as shown in FIG. 4, whereas the amorphous silicon film obtained at a lower frequency exhibited electric conductivity of only $3.0 \times 10^{-3}$ to $1.7 \times 10^{-4}$ $(\Omega\ cm)^{-1}$ as shown in FIG. 3.

In contrast, the method of this invention is noted to have produced an amorphous silicon film exhibiting electric conductivity exceeding $3.0 \times 10^{-4}$ $(\Omega\ cm)^{-1}$ as shown in FIG. 2.

Thus the present invention permits a semiconductor of quality equal to or better than the product obtained by use of a power source of high frequency of 13.56 MHz to be produced even by use of a power source having a lower frequency.

In the aforementioned working example, 10 mol % silane gas diluted with hydrogen was used exclusively. It goes without saying that the method of this invention can be applied to the production using diborane or other similar gas containing boron or other similar element of the Group III of the Periodic Table of Elements or a silane type gas incorporating phosphine or other similar gas containing phosphorus or some other element of the Group V of the Periodic Table of Elements for the purpose of obtaining a doped film. Optionally, the silane type gas may be used in combination with a hydrocarbon or ammonia to produce a silicon compound semiconductor containing other elements such as silicon carbide, for example.

What is claimed is:

1. A method for the production of a semiconductor by the glow discharge decomposition of a silane type gas, characterized by effecting said glow discharge decomposition of introduced silane type gas with a plurality of opposed electrodes disposed substantially perpendicular to a substrate and insulated from the ground potential and subsequently allowing the product of said decomposition to be deposited on said substrate disposed so as to be exposed to said introduced silane type gas.

2. A method according to claim 1, wherein the frequency of the power source used in said glow discharge decomposition falls in the range of 1 KHz to 10 MHz.

* * * * *